United States Patent [19]
Ohmi et al.

[11] Patent Number: 5,326,035
[45] Date of Patent: Jul. 5, 1994

[54] HIGH PURITY CLEANING SYSTEM

[75] Inventors: Tadahiro Ohmi, 1-17-301, Komegabukuro 2-chome, Aoba-ku, Sendai-shi, Miyagi-ken 980, Japan; Michiya Kawakami, Tokyo; Yasuyuki Yagi, Sendai; Makoto Ohwada, Iwaki; Kiyoshi Takahara, Tokyo, all of Japan

[73] Assignee: Tadahiro Ohmi, Miyagi, Japan

[21] Appl. No.: 867,692

[22] PCT Filed: Jan. 7, 1991

[86] PCT No.: PCT/JP91/00002
§ 371 Date: Sep. 4, 1992
§ 102(e) Date: Sep. 4, 1992

[87] PCT Pub. No.: WO91/11021
PCT Pub. Date: Jul. 25, 1991

[30] Foreign Application Priority Data

Jan. 7, 1990 [JP] Japan .................................... 2-873

[51] Int. Cl.$^5$ .................................................. B05B 1/24
[52] U.S. Cl. ........................ 239/135; 239/DIG. 19; 134/902
[58] Field of Search ................... 134/2, 902, 42; 210/900; 239/135, 591, DIG. 19; 138/145

[56] References Cited

U.S. PATENT DOCUMENTS

| | | | |
|---|---|---|---|
| 3,870,033 | 3/1975 | Faylor et al. | 210/167 |
| 4,092,176 | 5/1978 | Kozai et al. | 134/902 |
| 4,239,661 | 12/1980 | Muraoka et al. | 134/72 |
| 4,832,753 | 5/1989 | Cherry et al. | 134/42 |

OTHER PUBLICATIONS

IBM Technical Disclosure Bulletin; "Process Equipment Cleaning with Ultrapure Steam" vol. 28, No. 8 (Jan. 1979).

*Primary Examiner*—R. Bruce Breneman
*Assistant Examiner*—Thomas G. Dunn, Jr.
*Attorney, Agent, or Firm*—Baker & Daniels

[57] ABSTRACT

A method of cleaning under high temperature and high pressure and cleaning equipment to be used in a cleaning process now being employed in such industrial fields as the electronics industry centering around the semiconductor industry and the optical machine industry. The high temperature/high pressure cleaning equipment has at least a compressing pump, a heating device, a nozzle, and piping, and, in the cleaning equipment to inject high temperature/high pressure water from a nozzle to the matter to be cleaned, functions to inject high temperature/high pressure ultrapure water from the nozzle to the matter to be cleaned. Cleaning is carried out by injecting ultrapure water having a relative resistance of 17.0 M/l-cm or more when converted at 25° C. to a matter to be cleaned.

8 Claims, 5 Drawing Sheets

# HIGH PURITY CLEANING SYSTEM

BACKGROUND OF THE INVENTION

The present invention relates to a cleaning process now being employed in, for instance, the electronics industry centering around the semiconductor industry, and the optical equipment industry, and a method of cleaning under high temperature and high pressure and cleaning equipment to be used in a cleaning process for parts and components used in the industries.

BACKGROUND OF THE INVENTION

Cleaning has been carried out in every industry, and various devices have been carried out according to the purpose and characteristics of each cleaning process such as degreasing.

In association with sophistication of industrial technologies in recent years, development of a cleaning technology to realize higher purity is now strongly required. Also problems of pollution and contamination due to industrial effluents have occurred in recent years, and especially destruction of environment by Freon or trichloroethylene used in degreasing processes has caused a serious social problem, and now officials of the government institutions taking charge of the problems are investigating the possibility of prohibiting the use of these chemicals.

However, these chemicals are indispensable for the current cleaning process, and also development of an alternative cleaning technology is an urgent necessity.

Typical spray cleaning with high temperature/high pressure water is generally carried out in the apparatus as shown in FIG. 5, and description is made hereinafter for spray cleaning with high temperature/high pressure water with reference to FIG. 5.

A purpose of spray cleaning with high temperature/high pressure water is to completely remove impurities from a surface to be cleaned. In FIG. 5, water supplied to a water tank 102 by a cleaning water supply pipe 101 is pressurized by a compressing pump 103, heated by a heating device 104, injected as spray by a nozzle 106, and used for cleaning. When injected, the cleaning water should have, for instance, a temperature of 60° C. or more and a pressure of kg/cm$^2$ or more. This method is an effective one to remove contamination of a surface of a matter to be cleaned with a physical force of injected water.

In this case, the water supplied by the cleaning water supply pipe 101 is generally city water or pure water having a relative resistance of 1 to several MΩ-cm, and in FIG. 5 the piping 101 is connected to a water service pipe.

However, even if cleaning of a material to be cleaned is carried out by employing the technology as described above, it is not always possible to completely remove contamination from a surface of the matter.

For instance, if we leave a fingerprint and machine oil on a surface of a matter to be cleaned and clean the matter to be cleaned with the fingerprint and machine oil left on it by applying the above technology, the fingerprint and machine oil are not removed completely and remain on the surface of the matter.

Namely, a cleaning effect in the aforesaid technology is not excellent.

An object of this invention is to provide a method of cleaning under high temperature and high pressure and cleaning equipment, both having an excellent effect.

SUMMARY OF THE INVENTION

The method of cleaning under high temperature and high pressure according to the present invention to achieve the object as described above is characterized in that cleaning is carried out by injecting ultrapure water having a relative resistance of 17.0 MΩ-cm or more when converted at a temperature of 25° C. to the matter to be cleaned.

The high temperature/high pressure cleaning equipment according to the present invention to achieve the object as described above is characterized in that the cleaning equipment functions to inject high temperature/high pressure pure water from a nozzle to the matter to be cleaned in cleaning equipment which has at least a compressing pump, a heating device, a nozzle, and piping, and injects high temperature/high pressure water from the nozzle to the matter to be cleaned.

Description is made hereinafter for effects and a detailed composition of the present invention as well as for the findings obtained when the present invention was made.

Conventionally it had been considered that, in spray cleaning with high temperature/high pressure water, contamination on a surface of the matter to be cleaned is removed by the physical force of exhausted water. For this reason, the inventors tried to raise the pressure of the cleaning water to obtain a better cleaning effect, but improvement of the cleaning effect was not always observed under such raised pressure conditions.

So the inventors thoroughly investigated factors contributing to a cleaning effect in spray cleaning with high temperature/high pressure water.

As a result, the inventors got the idea that probably the purity of water to be sprayed on the matter to be cleaned contributes to the cleaning effect in spray cleaning with high temperature/high pressure water.

Even though it could be guessed that probably the purity of water would substantially contribute to the cleaning effect, whether it was true or not, and even if it is true, to what degree the purity of cleaning water should be raised to obtain a higher cleaning effect was not known at all. So the inventors repeated many experiments and found out that a cleaning effect can rapidly and substantially be improved by adjusting the purity of cleaning water to 17.0 MΩ-cm or more when converted at 25° C. and the present invention was made based on this finding The reason why the cleaning effect is rapidly and substantially improved by adjusting the purity of cleaning water to 17.0 MΩ-cm or more when converted at 25° C. is still not clear, but it can be guessed that, in case of water having a high purity as described above, a property of water to dissolve many matters in it and remove contamination is exhibited, and also that impurities or particles in water do not deposit on the surface of the matter to be cleaned.

Then, based on the above-described finding, the inventors carried out an experiment using ultrapure water having a relative resistance of 18.25 MΩ-cm which is equivalent to a concentration of impurities therein of less than 1 ppb in city water and the conventional cleaning equipment as described above. However, improvement of the cleaning effect could not be observed.

So the inventors continued to experiment under various conditions, and found out that, even if ultrapure water having an impurity concentration of less than 1 ppb is used as water to be supplied, impurities are contained in water injected from a nozzle in a range from 100 s ppb to 100 s ppm.

The inventors investigated where the impurities come into the cleaning water, and found out that contamination by impurities occurs due to the elusion of impurities from such portions as the compressing pump 103, the heating device 104, and the piping 105.

Furthermore, it was confirmed that particles are generated from a sliding section of the compressing pump 103, and also it was surprisingly found out that particles are generated from the piping 105 in addition to the elusion of impurities. It can be considered that this phenomenon occurs because of friction between high pressure water and the surface of the piping or other matters. Also it was found out that, in spray cleaning with high temperature/high pressure water, particles collide at high speed against the surface to be cleaned, and damage occurs to the surface.

To solve the problems as described above, the inventors installed such a device as refining equipment or a filter at the end of the cleaning equipment, but the pressure loss due to the refining device or filter was very large, and when such a device was installed downstream from the compressing pump, an appropriate injection pressure could not be obtained, and also the cleaning effect remarkably decreased.

As described above, the inventors found out that only using ultrapure water as feed water is inappropriate to raise the cleaning effect, and that cleaning equipment that injects high temperature/high pressure ultrapure water from a nozzle to the matter to be cleaned must be used to raise the cleaning effect.

However, cleaning equipment having such a function had not previously existed.

So the inventors searched for a means for preventing water from being contaminated by impurities, and found out that contamination of water by impurities can be prevented by using, for instance, a material covered with a passivated film formed in ultrahigh purity (a concentration of impurities of several ppb or less) oxidizing atmosphere on the surface of metal having no layer which can be affected during processing of the portion which comes into contact with the ultrapure water. Especially, it is preferable to use a material covered with a passivated film formed by heating and oxidizing under a temperature in a range from 150° C. or more to less than 400° C.

What is especially important is the finding that, when such a material is used in a sliding part of a compressing pump, the quantity of particles generated from the sliding part can substantially be reduced.

It should be noted that it is preferable to use a heating apparatus which can freely adjust the temperature of the water to be heated. For instance, it is preferable to use a lamp heating device or an electric heater.

Also it is preferable to heat ultrapure water without contacting the ultrapure water to the heating device. It is recommend to heat ultrapure water with, for instance, a heat exchanger.

Also it is preferable to install a portion of or all of the compressing pump, a heating apparatus, a nozzle, and a piping inside a clean room because contamination by impurities can largely be reduced.

Also it should be noted that such a chemical as a surface active agent may be mixed in pure water when the cleaning method according to the present invention is applied. In this case, the cleaning effect can be raised more.

Needless to say, the method or the equipment according to the present invention is effective for cleaning the surface of a substrate such as a wafer, and that they may be used for cleaning a wall surface of, for instance, a sputtering device. In that case, it is possible not only to carry out cleaning of a wall surface within an extremely short period of time, but also to substantially reduce the time to restart the equipment after cleaning (time for reinitialization). It should be noted that cleaning a wall surface with high temperature/high pressure ultrapure water has not been previously carried out.

DESCRIPTION OF THE NUMERALS

Figure 1:
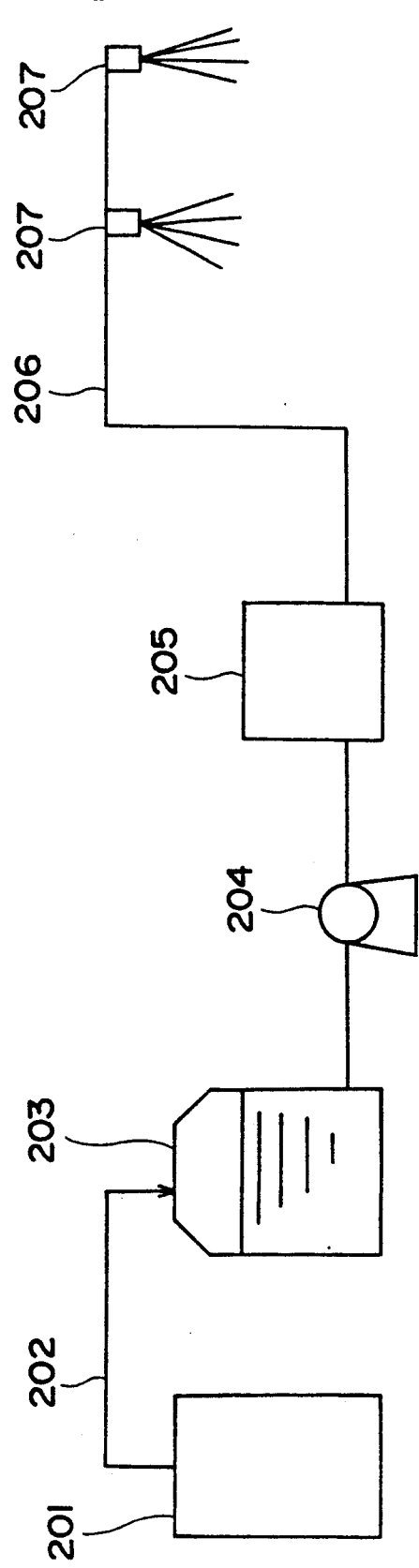
FIG. 1 is a schematic diagram of cleaning equipment illustrating an embodiment of the present invention.

101 . . . A cleaning water feed piping
102, 103 . . . Water tank
103, 104 . . . Compressing pump
104, 205 . . . Heating device
105, 206 . . . Piping
106, 207 . . . Nozzle
201 . . . Ultrapure water feeder
202 . . . Ultrapure water feed piping

DESCRIPTION OF THE PREFERRED EMBODIMENT

An embodiment of the present invention is shown in FIG. 1. In FIG. 1, ultrapure water fed from an ultrapure water feeder 201 to a water tank 203 is supplied to a compressing pump 204, heated by a heating device 205, and injected from a nozzle to a surface to be cleaned in the form of a spray.

In this embodiment, stainless steel (SUS 316 L material, JLS standard) processed as described hereinafter was used in the part or surface which comes into contact with the ultrapure water. Stainless steel having a surface finished to a mirror-like state by means of electrolytic polishing (with the surface roughness of less than 5 $\mu$nm) was oxidized in an extremely pure oxidizing atmosphere with a very low concentration (several ppb or less) of impurities (such as, especially, moisture and hydrocarbons). The oxidizing temperature was 380° C., while the thickness of the passivated film was in a range from 70 to 80 Å. Also the above oxidized passivated film was an extremely fine film, an oxidized passivated surface of $Cr_2O_3$ featuring a low degree of degassing, high heat resistance, excellent chemical resistance, and a small quantity of impurities dissolved into ultrapure water. Also a Ti material with a nitrated film formed by nitriding in an ultrapure atmosphere may be used in place of stainless steel having the oxidized passivated state of $Cr_2O_3$ as a main component.

The part or surface described above which comes into contact with the ultrapure water includes an internal surface of the ultrapure water feeder 201, an internal surface of the water tank 203, a surface of the compressing pump 204 including its sliding portion, an internal surface of the heating device 205, an internal surface of the piping, and an internal surface of the nozzle.

Figure 2:
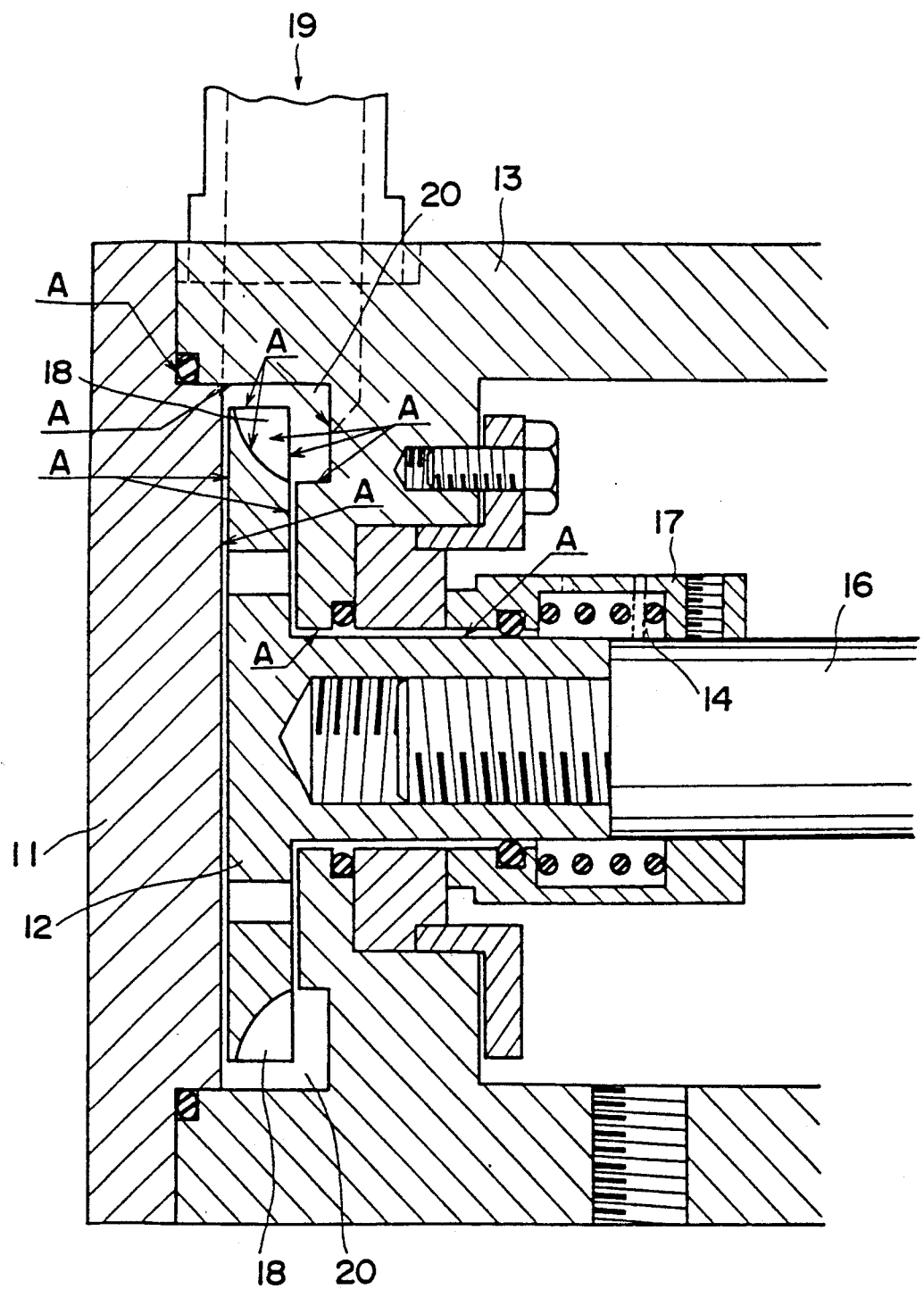
FIG. 2 is a cross-sectional view of a compressing pump used in an embodiment of the present invention.

It should be noted that, in this embodiment, a vortex pump, which forcibly discharges impurities or particles from the sliding portion to outside of the system as rejected water, was used as a compressing pump. It should be noted that a spiral pump to forcibly discharge impurities or particles from a sliding section to outside of the system as rejected water may be used. An example of a representative composition of a centrifugal pump is shown in FIG. 2. A hole communicating to the outside is arranged in a bearing seal 14 between a bearing 17 and a shaft 16. Water adjacent to the sliding portion (water-containing particles from the sliding portion) is discharged to outside of the system from this hole. Note that the section denoted by the letter "A" in FIG. 2 is the part where a passivated surface has been formed.

Various types of nozzles, each having a different pattern and injection angle, are sold in the market, and nozzles, each allowing a specific form of injected water flow such as a fan, a cone, or a straight line, are available according to the purpose of its use. However, as water flows in high speed at an injection port of a nozzle, abrasion or generation of particles occurs in an ordinary nozzle. In contrast to it, in the present invention, the aforesaid SUS 316 L stainless steel material with an oxidized passivated film formed on the surface was used as a material for the injection port of the nozzle featuring a small quantity of particles generated therefrom and a low degree of friction. The spray pattern was a fan with the injection angle of 12, but it is needless to say that other types of nozzle are also available. FIG. 1 shows a system having 2 nozzles.

In spray cleaning equipment using high temperature/high pressure ultrapure water with a metallic passivated film formed on the surface of the part in contact with the ultrapure water, elusion of impurities and generation of particles from the surface in contact with the water was suppressed, and when ultrapure water was fed to the cleaning equipment, the relative resistance of ultrapure water delivered from the nozzle was the same as that of ultrapure water at the entrance of the equipment.

When the high temperature/high pressure ultrapure water, which did not contain any impurity and was active, was used, the cleaning effect was higher as compared to that in spray cleaning using ordinary high temperature/high pressure water, and machine oil intentionally applied to and fingerprints intentionally left on a surface of the SUS 316 L stainless steel material were completely removed by means of electrolytic complex polishing.

Results of measurement by an APIMS (atmospheric ionization mass spectrography) of a degree of degassing from a matter to be cleaned under a raised temperature when cleaning with an ordinary chemical was carried out and when spray cleaning with high temperature/high pressure ultrapure water was carried out by using the equipment as shown in FIG. 1 after cleaning with the ordinary chemical as described above are shown in FIG. 2 and FIG. 3, respectively.

In this experiment, a test piece (for contrast) which was cleaned with chemicals such as HCl and $H_2O_2$ after complex electrolytic polishing of the SUS 316 L material and another test piece made by cleaning the former test piece for 20 minutes with high temperature/high pressure ultrapure water spray having a temperature of 60° C. and a pressure of 10 $Kg/cm^2$ G using the equipment shown in FIG. 1 and dried in high purity $N_2$ gas were heated to 350° C. separately, and a degree of degassing from the surface of each piece was measured with an APIMS.

Figure 3:
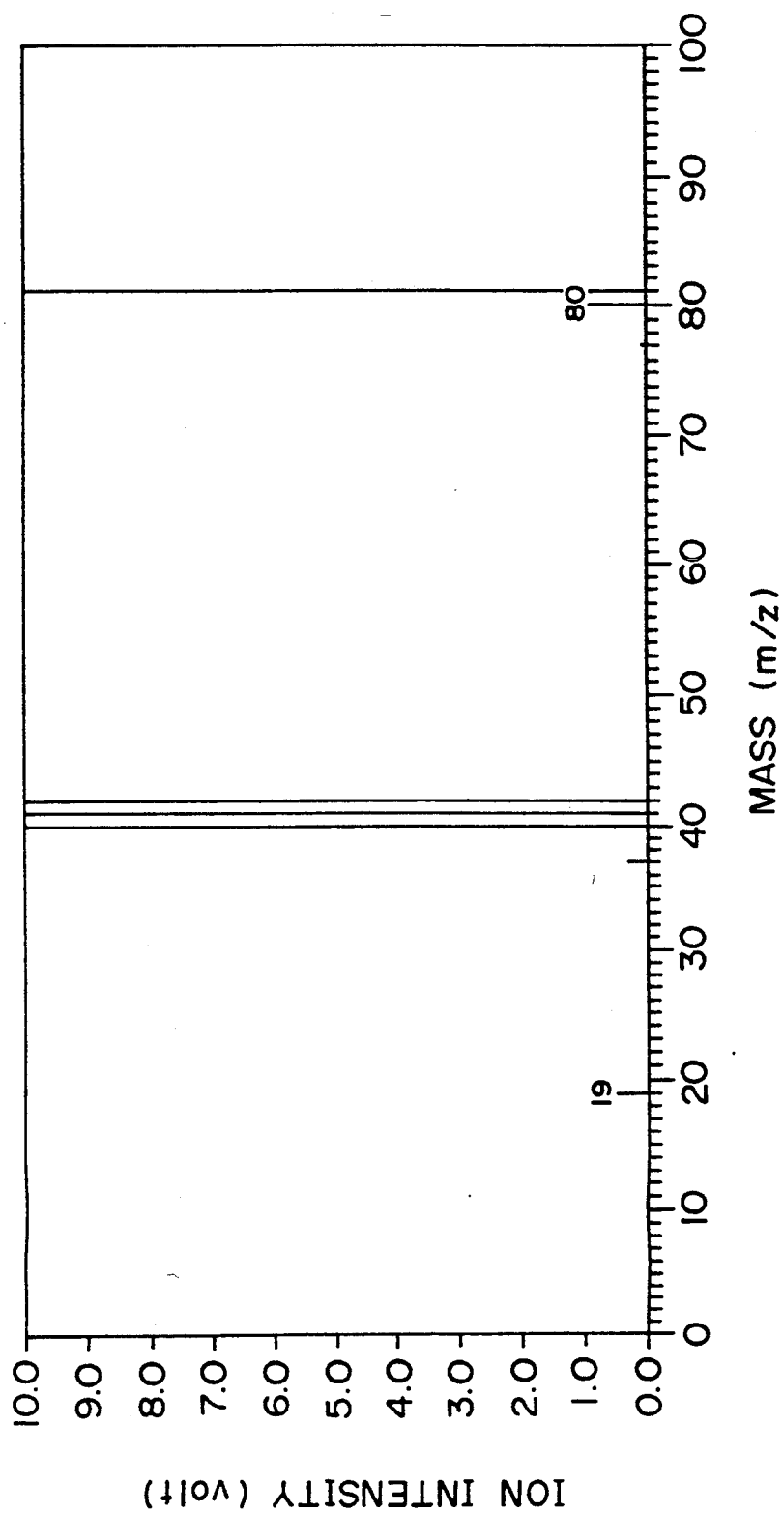
FIG. 3 is a graph showing the cleaning effect obtained in an embodiment of the present invention.
Figure 4:
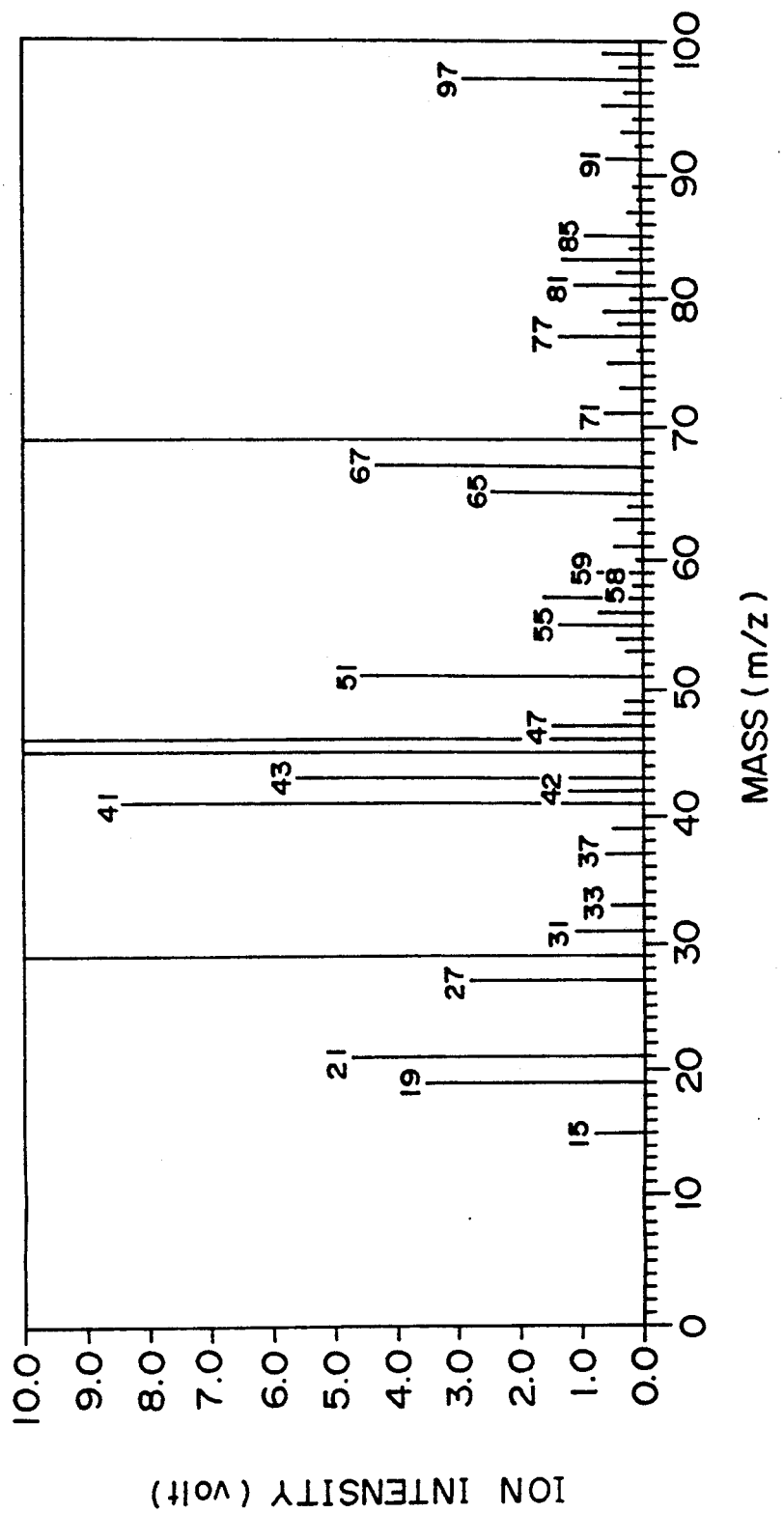
FIG. 4 is a graph showing the cleaning effect in an example for comparison.
Figure 5:
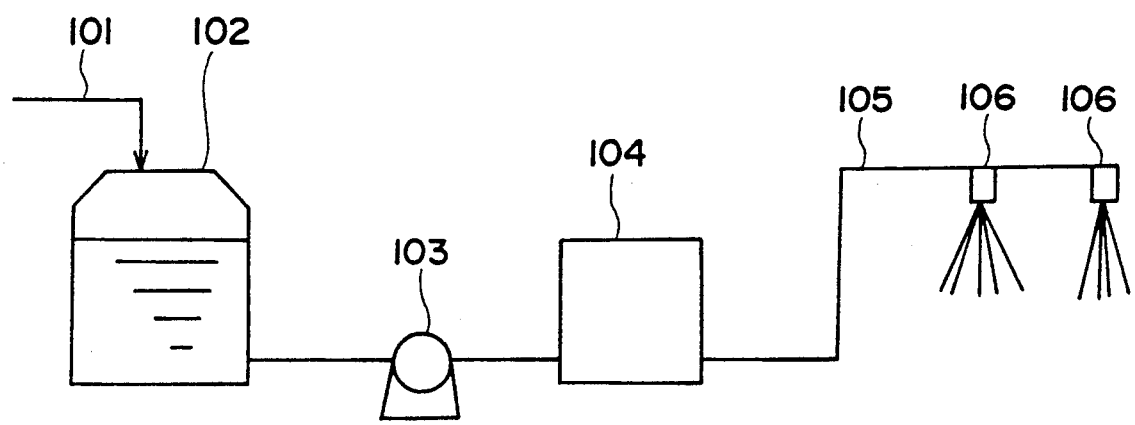
FIG. 5 is a schematic diagram of a conventional type of cleaning equipment.

In FIG. 2 and FIG. 3, m/Z values of 40 and 41 indicate peaks by Ar which is a carrier gas, M/Z values of 18 and 19 indicate peaks by moisture, and other values indicate peaks by impurities such as hydrocarbons. Comparison between the results shown in FIG. 2 and FIG. 3 shows that the impurities such as hydrocarbons, which are not removed by means of cleaning with chemicals, can completely be removed by spray cleaning with high temperature/high pressure ultrapure water. Based on the results, it could be confirmed that a cleaning effect of spray cleaning with high temperature/high pressure ultrapure water is larger.

In a second embodiment, a centrifugal pump was used as a compressing pump. It should be noted that the stainless steel with a passivated film formed on it as described above was used in the part of the surface which contacts the ultrapure water.

In this embodiment, ultrapure water with a relative resistance of 18.25 M$\Omega$-cm was used as feed water. Other points were the same as those in the first embodiment.

In this embodiment, a relative resistance of water when injected was 17.0 M$\Omega$-cm, but fingerprints and machine oil intentionally left on the surface were completely removed.

In this example for comparison, feed water was supplied so that a relative resistance of water when injected would become 16.0 M$\Omega$-cm. In this case, fingerprints and machine oil intentionally left on the surface were not completely removed.

As described above, it has become possible to prevent a cleaning effect from going down due to decrease of purity as observed in conventional types of cleaning equipment and to carry out spray cleaning with high temperature/high pressure water.

Fats and oils, which have been removed by means of cleaning with Freon, can be removed, so that the cleaning equipment according to the present invention can be used as an alternative for Freon effectively. Also as described above, it is fully possible to use the cleaning equipment according to the present equipment to eliminate, or as an alternative for, the current process of cleaning with chemicals. Also the cleaning equipment according to the present invention is fully available for cleaning wafers in the semiconductor industry where the technology has not been carried out because of impurities in cleaning water.

We claim:

1. A cleaning system for delivering a flow of ultrapure water to the surface of an object, comprising:
   a source of ultrapure water;
   a nozzle for delivering a flow of ultrapure water toward the surface of an object;
   a conduit connecting said ultrapure water source to said nozzle in fluid communication with one another;

a heater attached to said conduit for heating the ultrapure water as it flows through said conduit; and a pump in fluid communication with said conduit for effecting a flow of ultrapure water from said source to said nozzle;

wherein each surface of the cleaning system over which the ultrapure water flows from said ultrapure water source to said nozzle comprises one of a metal and a metal alloy having a passivated film formed thereon, said film being formed by heating said surface in an ultrapure atmosphere and finishing said surface to a mirror-like state.

2. The cleaning system according to claim 1, wherein the ultrapure water has a relative resistance of 17.0 MΩ-cm or more when converted at 25° C.

3. The cleaning system according to claim 1, wherein said pump is designed to discard water-containing dusts generated from a sliding section of said pump.

4. The cleaning system according to claim 1, wherein said pump is adapted to freely change the flow rate pressure thereof.

5. The cleaning system according to claim 1, wherein said pump, heater, nozzle, and conduit are all disposed in a clean room.

6. The cleaning system according to claim 1, wherein said heater is adapted to freely adjust the temperature of the water to a given temperature.

7. The cleaning device according to claim 1, wherein said heater comprises one of a lamp heating furnace and an electric heater.

8. The cleaning system according to claim 1, wherein a plurality of nozzles are arranged therein.

* * * * *